(12) United States Patent
Ueda

(10) Patent No.: US 11,582,854 B2
(45) Date of Patent: Feb. 14, 2023

(54) MOUNTING TABLE AND CHARGE NEUTRALIZATION METHOD FOR TARGET OBJECT

(71) Applicant: TOKYO ELECTRON LIMITED, Tokyo (JP)

(72) Inventor: Takehiro Ueda, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 491 days.

(21) Appl. No.: 16/688,667

(22) Filed: Nov. 19, 2019

(65) Prior Publication Data
US 2020/0163193 A1    May 21, 2020

(30) Foreign Application Priority Data

Nov. 20, 2018  (JP) .............................. JP2018-216978

(51) Int. Cl.
*H05F 3/06* (2006.01)
*H01L 21/683* (2006.01)
*H01L 21/67* (2006.01)
*H01J 37/32* (2006.01)
*H01L 21/687* (2006.01)

(52) U.S. Cl.
CPC ............ *H05F 3/06* (2013.01); *H01J 37/3244* (2013.01); *H01J 37/32724* (2013.01); *H01L 21/67069* (2013.01); *H01L 21/6833* (2013.01); *H01J 37/32091* (2013.01); *H01J 2237/334* (2013.01); *H01L 21/6875* (2013.01); *H01L 21/68785* (2013.01)

(58) Field of Classification Search
None
See application file for complete search history.

(56) References Cited

U.S. PATENT DOCUMENTS

2010/0214712 A1* 8/2010 Yamawaku ......... H01L 21/6833
                                                           361/213

FOREIGN PATENT DOCUMENTS

JP         2010-199239 A     9/2010

* cited by examiner

*Primary Examiner* — Jany Richardson
(74) *Attorney, Agent, or Firm* — Weihrouch IP

(57) ABSTRACT

A mounting table is provided. The mounting table includes an electrostatic chuck configured to mount thereon a target object and attract and hold the target object using an electrostatic force, and a gas supply line configured to supply a gas to a gap between the target object mounted on the electrostatic chuck and the electrostatic chuck via the electrostatic chuck. The mounting table further includes at least one irradiation unit configured to irradiate light having a predetermined wavelength to the gas flowing through the gas supply line or to the gas supplied to the gap between the target object and the electrostatic chuck to ionize the gas.

6 Claims, 6 Drawing Sheets

MOUNTING TABLE AND CHARGE NEUTRALIZATION METHOD FOR TARGET OBJECT

CROSS-REFERENCE TO RELATED APPLICATIONS

This application claims priority to Japanese Patent Application No. 2018-216978, filed on Nov. 20, 2018, the entire contents of which are incorporated herein by reference.

TECHNICAL FIELD

The present disclosure relates to a mounting table and a charge neutralization method for a target object.

BACKGROUND

In an apparatus for processing a target object such as a semiconductor wafer or the like, the target object is mounted and processed on a mounting table disposed in a processing chamber. The mounting table is provided with an electrostatic chuck for attracting and holding the target object using an electrostatic force to prevent the target object from moving during the processing. When the processing is completed, application of a DC voltage to the electrostatic chuck is stopped and the electrostatic force of the electrostatic chuck is released. Then, the processed target object is lifted from the mounting base by support pins and transferred by a transfer unit.

However, depending on processing conditions and residues in the processing chamber, the electrostatic force may remain between the electrostatic chuck and the target object even when the application of the DC voltage to the electrostatic chuck is stopped. Especially, in vacuum processing such as plasma etching, charges of the target object are hardly released through a gas. When the electrostatic force remains between the target object and the electrostatic chuck, the target object may jump up due to the pressing force of the support pins, which may result in positional displacement. Further, the target object may be damaged depending on a magnitude of the remaining electrostatic force.

As a technique capable of avoiding the above-described drawbacks, there is known a technique for ionizing a gas outside a processing chamber and supplying the ionized gas to a semiconductor wafer via a mounting table (see, e.g., Japanese Patent Application Publication No. 2010-199239). Accordingly, negative charges on the backside surface of the semiconductor wafer are neutralized by positive ions in the ionized gas.

The present disclosure provides a mounting table and a charge neutralization method for a target object which can quickly neutralize charges of a processed target object.

SUMMARY

In accordance with an aspect of the present disclosure, there is provided a mounting table comprising: an electrostatic chuck configured to mount thereon a target object and attract and hold the target object using an electrostatic force, a gas supply line configured to supply a gas to a gap between the target object mounted on the electrostatic chuck and the electrostatic chuck, via the electrostatic chuck, and at least one irradiation unit configured to irradiate light having a predetermined wavelength to the gas flowing through the gas supply line or to the gas supplied to the gap between the target object and the electrostatic chuck to ionize the gas.

BRIEF DESCRIPTION OF THE DRAWINGS

The objects and features of the present disclosure will become apparent from the following description of embodiments, given in conjunction with the accompanying drawings, in which.

DETAILED DESCRIPTION

Hereinafter, embodiments of a mounting table and a charge neutralization method of the present disclosure will be described in detail with reference to the accompanying drawings. The following embodiments are not intended to limit the mounting table and the charge neutralization method of the present disclosure.

The processing for the target object may include processing using a relatively high voltage, such as processing using plasma. In this processing, if a supply line for supplying a gas to the target object via the mounting table is short, abnormal discharge may occur in the supply line. Therefore, it is required to lengthen the supply line for supplying the gas to the target object via the mounting table.

If the gas ionized outside the processing chamber is supplied to the target object through the long supply line, positive ions and negative ions in the ionized gas are bonded in the supply line. Therefore, it is difficult to supply a sufficient amount of ions to the target object. If a sufficient amount of ions is not supplied to the target object, a long period of time is required to neutralize charges of the target object and it is difficult to quickly unload or transfer the processed target object. As a result, a processing throughput decreases.

Therefore, the present disclosure provides a technique capable of quickly neutralizing charges of a processed target object.

<Outline of Plasma Processing Apparatus 1>

Figure 1:
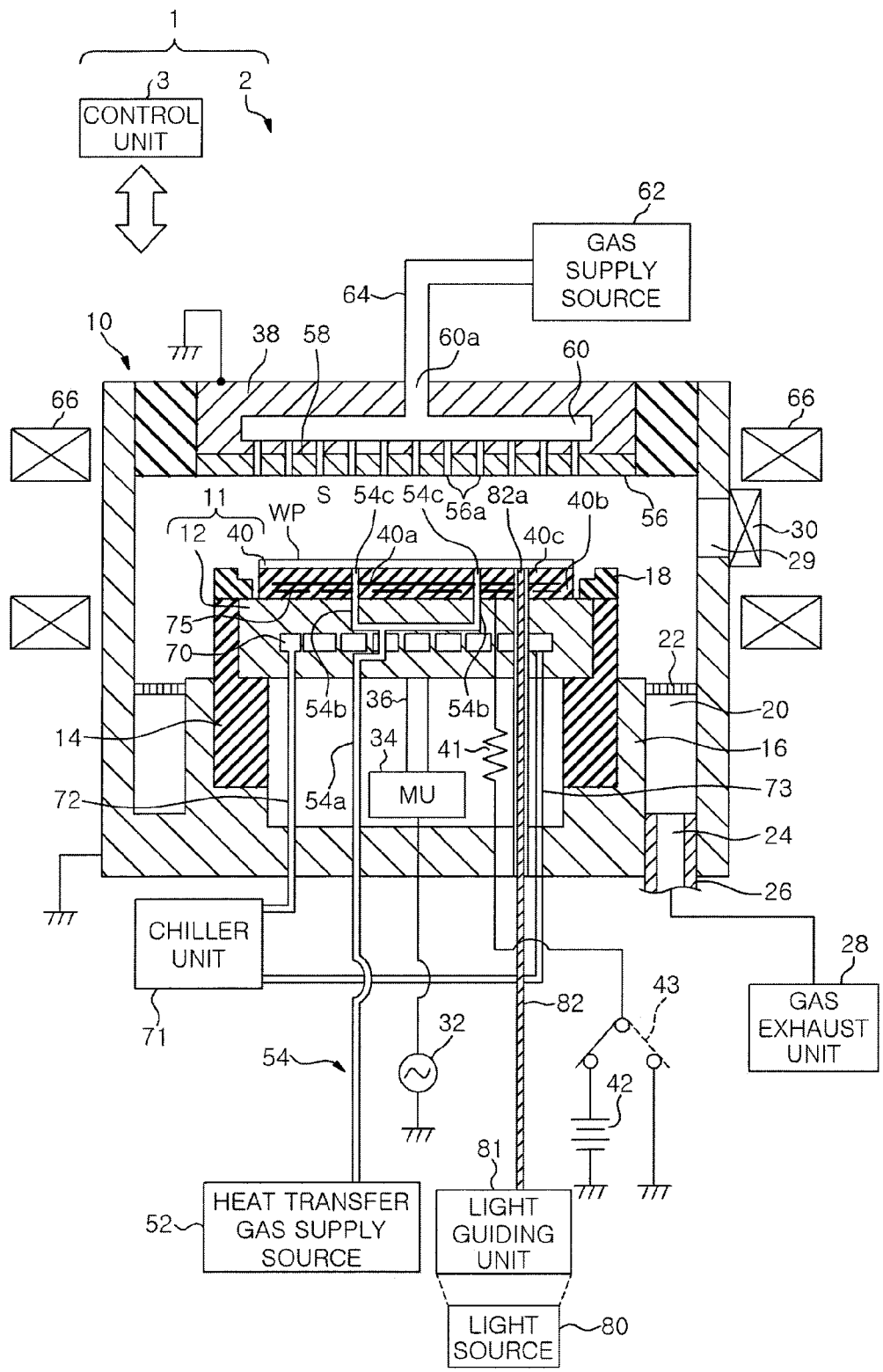
FIG. 1 is a schematic cross-sectional view showing an example of a plasma processing apparatus according to an embodiment.

FIG. 1 is a schematic cross-sectional view showing an example of a plasma processing apparatus 1 according to an embodiment of the present disclosure. The plasma processing apparatus 1 of the present embodiment is a capacitively coupled plasma etching apparatus. The plasma processing apparatus 1 includes an apparatus main body 2 and a control unit 3.

The apparatus main body 2 includes a substantially cylindrical processing chamber 10 made of a metal such as aluminum, stainless steel or the like. The processing chamber 10 is grounded. A mounting table 11 for mounting thereon a target object WP such as a semiconductor wafer or the like is disposed in the processing chamber 10. The mounting table 11 includes a base 12 and an electrostatic chuck 40.

The base 12 is formed in a substantially cylindrical shape and made of, e.g., aluminum, titanium, SiC, or the like. The base 12 is supported by a support 14 made of an insulating material. The support 14 is supported by a substantially cylindrical support member 16 extending vertically upward from a bottom portion of the processing chamber 10.

The electrostatic chuck 40 is disposed on the base 12. An annular edge ring 18 made of quartz or the like is disposed on an upper surface of the support 14 to surround the electrostatic chuck 40. The edge ring 18 converges plasma generated above the electrostatic chuck 40 toward the target object W. The edge ring 18 is also referred to as "focus ring".

A gas exhaust path 20 is formed between an inner wall of the processing chamber 10 and an outer wall of the support member 16. The gas exhaust path 20 is provided with an annular baffle plate 22 having a plurality of through-holes formed in a thickness direction thereof. A gas exhaust port 24 is formed at a bottom portion of the gas exhaust path 20. A gas exhaust unit 28 is connected to the gas exhaust port 26 through a gas exhaust line 26. The gas exhaust unit 28 has a vacuum pump (not shown), so that a pressure in the processing chamber 10 can be decreased to a predetermined vacuum level. An opening 29 for loading/unloading the target object WP is formed on a sidewall of the processing chamber 10. The opening 29 is opened/closed by a gate valve 30.

A high frequency power supply 32 is electrically connected to the base 12 via a power feed rod 36 and a matching unit (MU) 34. The high frequency power supply 32 supplies a high frequency power having a frequency suitable for plasma generation (e.g., 60 MHz) to the base 12. The base 12 also serves as a lower electrode.

The electrostatic chuck 40 is disposed on an upper surface of the base 12 in order to attract and hold the target object WP using an electrostatic force. The electrostatic chuck 40 has a structure in which a sheet-shaped electrode 40a made of a conductive film and a heater 75 are embedded between insulating films 40b and 40c made of a dielectric material. A switch 43 is connected to the electrode 40a via a resistor 41. The switch 43 switches a connection between the electrode 40a and the DC power supply 42 and a connection between the electrode 40a and a ground potential, under the control of the control unit 3.

When a voltage from the DC power supply 42 is applied to the electrode 40a, an electrostatic force is generated on the upper surface of the electrostatic chuck 40, and the target object WP is attracted and held on the upper surface of the electrostatic chuck 40 by the generated electrostatic force. When no voltage is applied to the electrode 40a, the electrode 40a is connected to the ground potential by the switch 43.

An AC power supply (not shown) is connected to the heater 75, and a desired AC voltage is applied from the AC power supply to the heater 75. By controlling the magnitude of the AC voltage applied to the heater 75, the amount of heat generated by the heater 75 can be controlled.

A flow path 70 is formed in the base 12. A coolant controlled to a predetermined temperature is supplied from a chiller unit 71 to the flow path 70 through a line 72. The coolant supplied to the flow path 70 is returned to the chiller unit 71 through a line 73. The temperature of the target object WP on the electrostatic chuck 40 can be adjusted to a desired temperature by the cooling of the chiller unit 71 and the heating of the heater 75.

Figure 2:
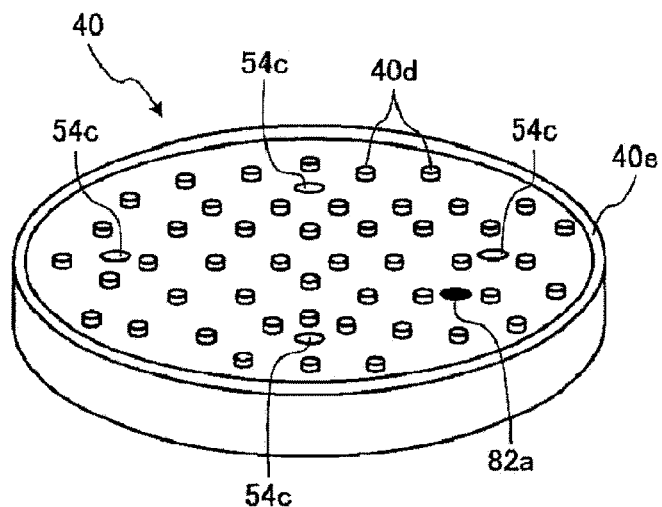
FIG. 2 is a perspective view showing an example of an electrostatic chuck.

FIG. 2 is a perspective view showing an example of the electrostatic chuck 40. As shown in FIG. 2, on the upper surface of the electrostatic chuck 40, an annular protrusion 40e is formed along the outer edge of the electrostatic chuck 40, and a plurality of protrusions 40d are formed at an inner side of the annular protrusion 40e. The target object WP attracted and held on the upper surface of the electrostatic chuck 40 by the electrostatic force is supported by the annular protrusion 40e and the protrusions 40d on the upper surface of the electrostatic chuck 40. Accordingly, a predetermined gap is formed between the target object WP and the electrostatic chuck 40. The protrusions 40d may be formed by performing, e.g., embossing processing, on the upper surface of the electrostatic chuck 40.

A heat transfer gas supply source 52 supplies, through a line 54, a heat transfer gas, e.g., He gas or the like, to the gap between the electrostatic chuck 40 and the target object WP attracted and held on the electrostatic chuck 40. The line 54 includes a first line 54a and a plurality of second lines 54b. The first line 54a is disposed in the base 12. The second lines 54b are connected to the first line 54a. Each of the second lines 54b is disposed in the base 12 and the electrostatic chuck 40. The heat transfer gas supplied from the heat transfer gas supply source 52 through the first line 54a is distributed to the second lines 54b, and then is supplied to the gap between the target object WP and the electrostatic chuck 40 through openings 54c formed in the upper surface of the electrostatic chuck 40. The line 54 is an example of a gas supply line. The first line 54a is an example of a first supply line, and the second lines 54b are examples of a second supply line.

A plurality of support pins (not shown) are disposed in the base 12 and the electrostatic chuck 40 to penetrate therethrough. The support pins are raised and lowered by an actuator (not shown). The electrostatic chuck is lifted by raising the support pins. The target object WP on the electrostatic chuck 40 is lifted by raising the lift pins and is transferred with respect to an external transfer arm (not shown).

An optical fiber 82 is disposed in the mounting table 11 to penetrate through the base 12 and the electrostatic chuck 40. One end of the optical fiber 82 is provided with a light guiding unit 81 including an optical component such as a lens or the like. An end surface 82a of the other end of the optical fiber 82 is exposed to the gap between the electrostatic chuck 40 and the target object WP.

A light source 80 outputs light having a predetermined wavelength. In the present embodiment, the light source 80 outputs ultraviolet (UV) light. Alternatively, the light source 80 may output light such as vacuum ultraviolet (VUV) light, soft X-ray, or the like. The light guiding unit 81 guides the light outputted from the light source 80 to the optical fiber 82.

The light guided into the optical fiber 82 by the light guiding unit 81 propagates through the optical fiber 82 and is irradiated from the end surface 82a to the gap between the electrostatic chuck 40 and the target object WP. Accordingly, the gas (e.g., He gas) in the gap between the electrostatic chuck 40 and the target object WP is ionized by the UV light irradiated from the end surface 82a of the optical fiber 82. Then, the charges remaining on the target object WP and the upper surface of the electrostatic chuck 40 are neutralized by positive ions and negative ions in the ionized gas. The end surface 82a of the optical fiber 82 is an example of an irradiation unit.

In the present embodiment, the light outputted from the light source 80 is guided to the gap between the target object WP and the electrostatic chuck 40 by the optical fiber 82. The light propagating from the light source 80 is irradiated with a sufficient intensity from the end surface 82a to the gap between the target object WP and the electrostatic chuck 40. Therefore, the gas in the gap between the electrostatic chuck 40 and the target object WP is sufficiently ionized by the light irradiated from the end surface 82a. Accordingly, in the plasma processing apparatus 1 of the present embodiment, a sufficient amount of ions can be supplied to the gap between the electrostatic chuck 40 and the target object WP.

A shower head 38 is disposed at a ceiling portion of the processing chamber 10. The shower head 38 is made of, e.g., aluminum having an anodically oxidized surface, and is grounded. The shower head 38 serves as an upper electrode opposed to the base 12. The high frequency power for plasma generation from the high frequency power supply 32 is applied to a capacitor including the base 12 and the shower head 38.

The shower head 38 includes an electrode plate 56 having a plurality of gas injection ports 56a penetrating therethrough in a thickness direction thereof, and an electrode support 58 that detachably supports the electrode plate 56. A buffer chamber 60 is formed in the electrode support 58 and communicates with the gas injection ports 56a. A gas inlet 60a is disposed at an upper portion of the buffer chamber 60. A gas supply source 62 for supplying a processing gas is connected to the gas inlet port 60a through a line 64. The processing gas supplied from the gas supply source 62 is supplied into the buffer chamber 60 through the line 64 and the gas inlet port 60a. The processing gas supplied into the buffer chamber 60 is diffused in the buffer chamber 60 and then supplied in a shower-like manner into the processing chamber 10 through the gas injection ports 56a.

A magnet 66 extending in an annular shape is disposed outside the processing chamber 10 to surround the processing chamber 10. In the processing chamber 10, an RF electric field is vertically generated in a plasma generation space S between the shower head 38 and the mounting table 11 by the high frequency power supply 32, and high-density plasma is generated near the surface of the mounting table 11 by high frequency discharge.

The control unit 3 includes a processor, a memory, and an input/output interface. The memory stores a program, a processing recipe, or the like. The processor executes a program read from the memory to control the respective components of the apparatus main body 2 via an input/output interface based on the processing recipe read from the memory.

<Charge Neutralization of the Target Object WP>

Figure 3:
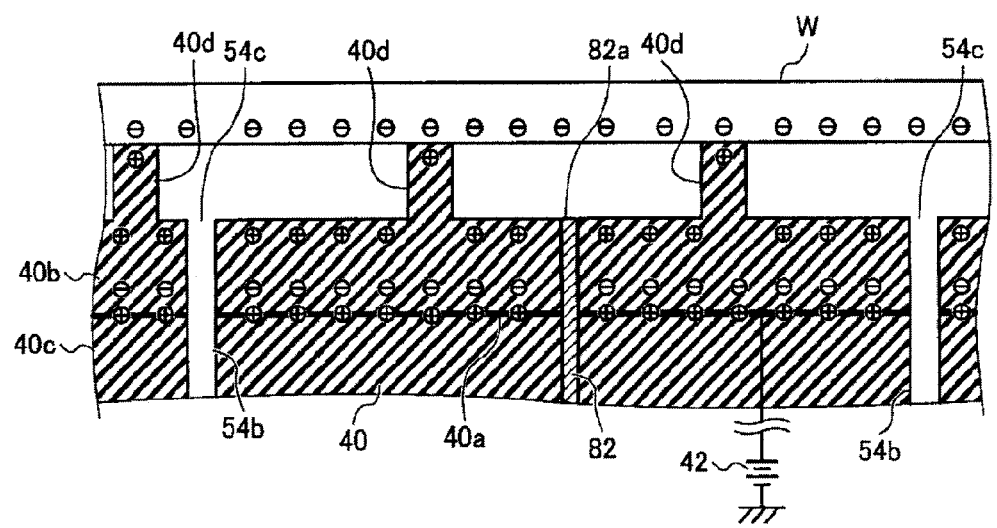
FIG. 3 schematically shows an example of a cross section of the electrostatic chuck attracting and holding a target object.

FIG. 3 schematically shows an example of a cross section of the electrostatic chuck 40 attracting and holding the target object WP. An unprocessed target object WP is mounted on the upper surface of the electrostatic chuck 40. The DC power supply 42 and the electrode 40a are connected by the switch 43. The DC voltage is applied from the DC power supply 42 to the electrode 40a. Accordingly, as shown in FIG. 3, "+" charges are supplied to the electrode 40a.

When "+" charges are supplied to the electrode 40a, dielectric polarization occurs in the insulating films 40b and 40c, and "+" charges are generated on the upper surface of the electrostatic chuck 40. Due to the "+" generated on the upper surface of the electrostatic chuck 40, "−" charges are generated on the bottom surface of the target object WP. Accordingly, an electrostatic attractive force is generated between the bottom surface of the target object WP and the upper surface of the electrostatic chuck 40, and the target object WP is attracted and held by the electrostatic chuck 40.

Figure 4:
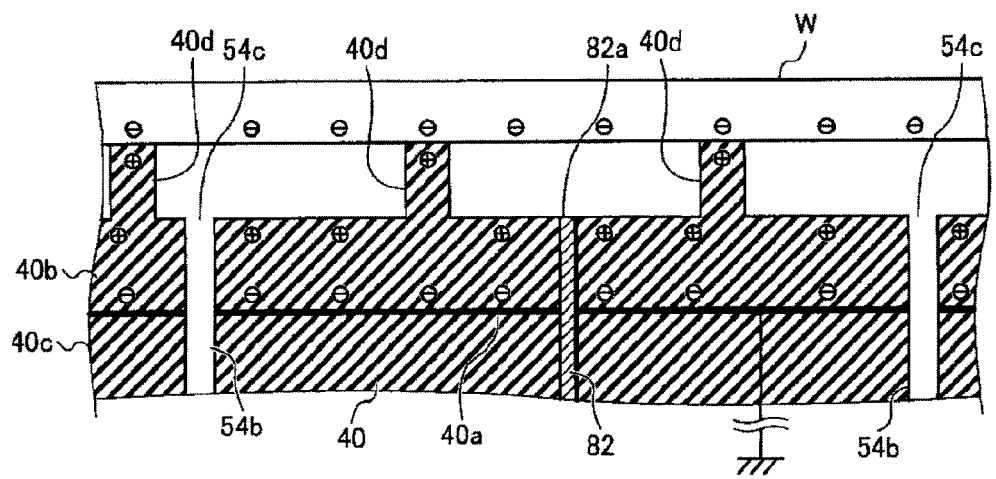
FIG. 4 schematically shows an example of the cross section of the electrostatic chuck in the case of stopping application of a DC voltage.

After predetermined processing such as etching or the like is performed on the target object WP, the electrode 40a is connected to the ground potential by the switch 43, thereby releasing the electrostatic force generated in the electrode 40a. However, depending on the processing conditions, even if the application of the DC voltage to the electrode 40a is stopped, charges may remain at the target object WP as shown in FIG. 4 and the electrostatic force may remain between the electrostatic chuck 40 and the target object WP. FIG. 4 schematically shows an example of the cross section of the electrostatic chuck 40 in the case of stopping the application of the DC voltage.

When the electrostatic force remains between the target object WP and the electrostatic chuck 40, if the support pins (not shown) are raised to lift the processed target object WP, the target object WP may jump up by the pressing force of the support pins, which may result in positional displacement. Further, the target object WP may be damaged depending on the magnitude of the remaining electrostatic force.

Therefore, it is considered to supply an ionized gas to the gap between the target object WP and the electrostatic chuck 40 after the application of the DC voltage to the electrode 40a is stopped. Accordingly, the charges remaining at the target object WP are neutralized by positive ions and negative ions in the ionized gas, and the electrostatic force between the target object WP and the electrostatic chuck 40 is reduced.

As a method for supplying an ionized gas, there was considered, e.g., a method for ionizing a gas using corona discharge or the like outside the processing chamber 10 and supplying the ionized gas to the gap between the target object WP and the electrostatic chuck 40 via the mounting table 11.

However, in an apparatus for performing processing using a high voltage for the target object WP, such as processing using plasma, if a supply passage for supplying a gas to the target object via the mounting table 11 is short, abnormal discharge may occur in the supply passage. Therefore, it is required to lengthen the supply passage for supplying the gas to the target object WP via the mounting table 11.

However, if the supply passage for the ionized gas is long, the positive ions and the negative ions in the ionized gas are neutralized in the supply passage, which makes it difficult to supply a sufficient amount of ions to the gap between the target object WP and the electrostatic chuck 40. If a sufficient amount of ions is not supplied to the gap between the target object WP and the electrostatic chuck 40, a long period of time is required to neutralize charges of the processed target object WP and it is difficult to quickly unload the processed target object WP. Thus, the processing throughput decreases.

Therefore, in the present embodiment, an optical fiber is disposed in the mounting table 11 to guide light having a predetermined wavelength to the gap between the target object WP and the electrostatic chuck 40. After the processing on the target object WP is completed and the application of the DC voltage to the electrode 40a is stopped, a predetermined gas is supplied to the gap between the target object WP and the electrostatic chuck 40.

Figure 5:
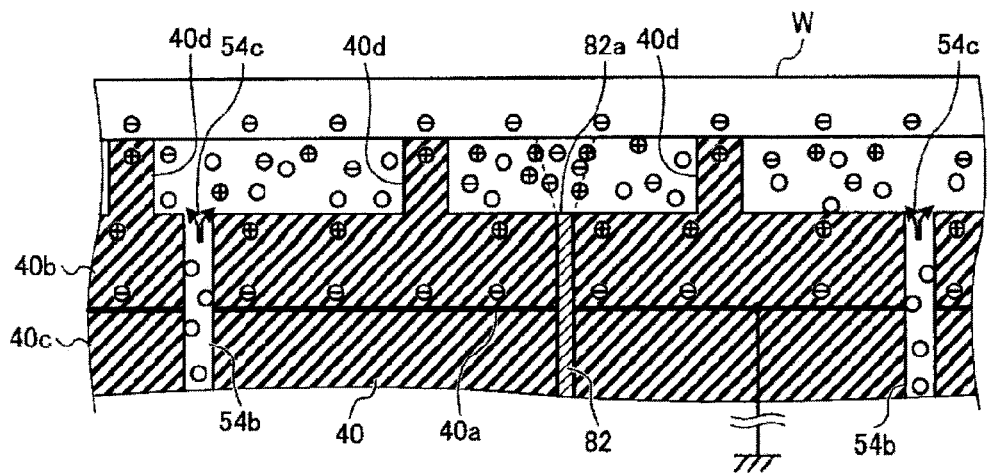
FIG. 5 schematically shows an example of the cross section of the electrostatic chuck in the case of performing charge neutralization.

As shown in FIG. 5, for example, a light having a predetermined wavelength is irradiated from the end surface 82a of the optical fiber 82b to the gap between the target object WP and the electrostatic chuck 40 through the optical fiber 82. FIG. 5 schematically shows an example of the cross section of the electrostatic chuck 40 in the case of performing charge neutralization. White circles shown in FIG. 5 indicate gas molecules before ionization.

Accordingly, the gas supplied to the gap between the target object WP and the electrostatic chuck 40 is ionized, and the charges of the target object WP are neutralized by the positive ions in the ionized gas. In the plasma processing apparatus 1 of the present embodiment, the gas is ionized near the target object WP, so that a sufficient amount of positive ions in the ionized gas can be supplied to the target object WP. Therefore, the electrostatic force between the target object WP and the electrostatic chuck 40 can be reduced quickly. Accordingly, the processed target object can be quickly transferred, and the processing throughput can be improved.

The negative ions in the ionized gas repel the target object WP charged with "−" and flow into the processing chamber 10 from the gap between the target object WP and the annular protrusion 40e of the electrostatic chuck 40. Then, the negative ions are exhausted through the gas exhaust path 20.

In the present embodiment, the gas supplied to the gap between the target object WP and the electrostatic chuck 40 in the case of neutralizing charges of the target object WP is, e.g., He gas. However, the present disclosure is not limited thereto. For example, $N_2$ gas or an inert gas such as a rare gas or the like may be supplied to the gap between the target object WP and the electrostatic chuck 40 in the case of neutralizing charges of the target object WP.

As the pressure of the gas supplied to the gap between the target object WP and the electrostatic chuck 40 increases, the number of molecules of the gas ionized between the target object WP and the electrostatic chuck 40 increases and the charge neutralization proceeds more quickly. However, as the charge neutralization of the target object WP proceeds, the electrostatic attractive force between the target object WP and the electrostatic discharge with the chuck 40 is reduced. Therefore, if the pressure of the gas supplied to the gap between the target object WP and the electrostatic chuck 40 is excessively high, the target object WP may jump up or slip off from the electrostatic chuck 40.

Accordingly, a pressure $P_{He}$ of the gas supplied to the gap between the target object WP and the electrostatic chuck 40 is preferably lower than or equal to a pressure P[Torr] expressed by the following equation Eq. (1):

$$P=P_S+(W/S_{WP})\times 0.73556 \qquad \text{Eq. (1)}$$

where a weight of the target object is W[g]; an area of a side of the target object WP which faces the electrostatic chuck is $S_{WP}[cm^2]$; and a pressure in the plasma processing space S is $P_S[Torr]$. The pressure $P_S$ in the plasma generation space S is an example of a pressure in a space facing a surface of the target object WP which is opposite to the surface facing the electrostatic chuck 40.

For example, when the target object WP is a silicon wafer having a thickness of 775 μm and a diameter of 300 mm, the weight W of the target object WP is approximately 127.6 g because silicon has a density of 2.33 $g/cm^3$. When the area $S_{WP}$ of the target object WP is, e.g., about 706.8 $cm^2$ and the pressure $P_S$ in the plasma generation space S is, e.g., about 0.1 Torr, the pressure $P_{He}$ of the gas supplied to the gap between the target object WP and the electrostatic chuck 40 is preferably about 0.2324 Torr or lower.

<Charge Neutralization Method>

Figure 6:
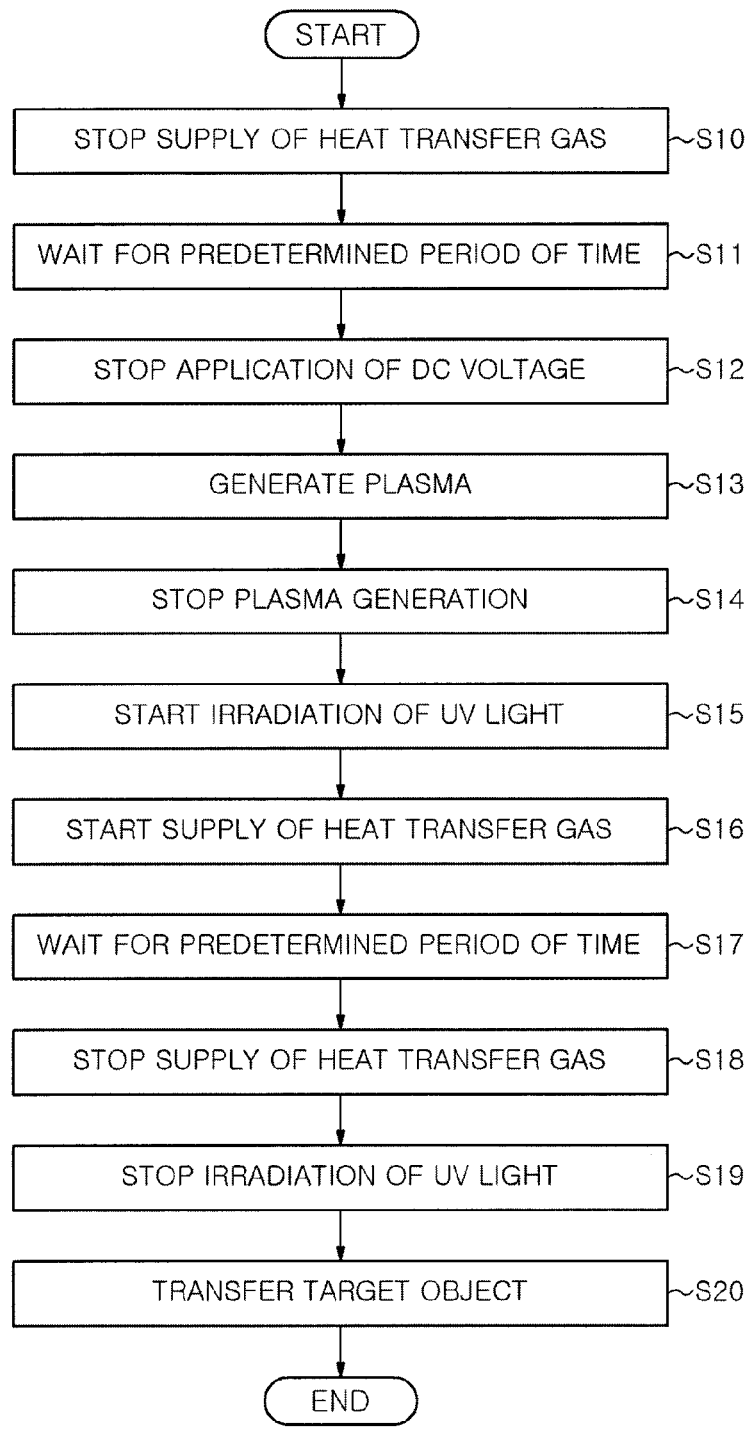
FIG. 6 is a flowchart showing an example of a charge neutralization method according to an embodiment.

FIG. 6 is a flowchart showing an example of a charge neutralization method according to an embodiment of the present disclosure. The processes shown in the flowchart of FIG. 6 are started after the processing such as etching or the like on the target object WP is completed. The processes shown in the flowchart of FIG. 6 are executed under the control of the control unit 3.

First, the control unit 3 controls the heat transfer gas supply source 52 to stop the supply of heat transfer gas to the gap between the target object WP and the electrostatic chuck 40 (step S10). The mounting table 11 waits for a predetermined period of time until the heat transfer gas between the target object WP and the electrostatic chuck 40 is exhausted from the gap between the target object WP and the annular protrusion 40e of the electrostatic chuck 40 (step S11). Then, the control unit 3 controls the switch 43 to stop the application of the DC voltage to the electrode 40a of the electrostatic chuck 40 (step S12). Step S12 is an example of a stop process.

Next, plasma for charge neutralization is generated in the processing chamber 10 for a predetermined period of time (step S13). Then, the plasma generation is stopped (step S14). The plasma generated in the processing chamber 10 in step S13 is weaker than the plasma generated in the processing chamber 10 in the case of performing the processing such as etching or the like on the target object WP. In step S13, plasma of a mixed gas containing, e.g., Ar gas and $O_2$ gas, is generated in the processing chamber 10. Therefore, the charges of the target object WP are neutralized to a certain extent using the plasma. However, when the target object WP is neutralized by using plasma, charges corresponding to a plasma potential $V_{dc}$ remain at the target object WP.

Next, the control unit 3 controls the light source 80 to output UV light. The UV light outputted from the light source 80 is guided into the optical fiber 82 via the light guiding unit 81, propagates through the optical fiber 82, and then is irradiated to the gap between the target object WP and the electrostatic chuck 40 from the end surface 82a (step S15). Step S15 is an example of an ionization process.

Next, the control unit 3 controls the heat transfer gas supply source 52 to start the supply of the heat transfer gas to the gap between the target object WP and the electrostatic chuck 40 (step S16). Accordingly, the gas supplied to the gap between the target object WP and the electrostatic chuck 40 is ionized by the UV light irradiated from the end surface 82a of the optical fiber 82, and the charges of the target object WP are neutralized by the ions. Step S16 is an example of a supply process. Step S16 may be executed prior to step S15.

Next, the control unit 3 waits for a predetermined period of time until the charges of the target object WP are sufficiently neutralized (step S17). Then, the control unit 3 controls the heat transfer gas supply source 52 to stop the supply of the heat transfer gas to the gap between the target object WP and the electrostatic chuck 40 (step S18). Then, the control unit 3 controls the light source 80 to stop the output of UV light (step S19).

Next, the control unit 3 controls an actuator (not shown) to raise the support pins. Accordingly, the target object WP is lifted from the electrostatic chuck 40, and the target object WP is transferred by a transfer arm (not shown) (step S20).

In accordance with the embodiments of the present disclosure, the plasma processing apparatus 1 of the present embodiment includes the mounting table 11. The mounting table 11 has the electrostatic chuck 40, the line 54, and the end surface 82a of the optical fiber 82. The electrostatic chuck 40 mounts thereon the target object WP and attracts and holds the target object WP using an electrostatic force. The gas is supplied through the line 54 and reaches the gap between the target object WP mounted on the electrostatic chuck 40 and the electrostatic chuck 40 via the electrostatic chuck 40. The gas supplied to the gap between the target object WP and the electrostatic chuck 40 is ionized by irradiation of the light having a predetermined wavelength from the end surface 82a of the optical fiber 82. Accordingly, charges of the processed target object WP can be neutralized quickly.

The mounting table 11 in the above-described embodiments further includes the optical fiber 82 that is disposed in the electrostatic chuck 40 and guides the light outputted from the light source 80 disposed outside the mounting table 11 to the end surface 82a. Therefore, ions can be generated between the electrostatic chuck 40 and the target object WP, and a sufficient amount of ions can be supplied to the gap between the electrostatic chuck 40 and the target object WP.

In the above-described embodiments, the light applied to the gas supplied to the gap between the electrostatic chuck 40 and the target object WP is UV light, VUV light, or soft X-ray. Accordingly, the gas supplied to the gap between the electrostatic chuck 40 and the target object WP can be ionized.

In the above-described embodiments, the pressure $P_{He}$ of the gas supplied to the gap between the target object WP and the electrostatic chuck 40 is lower than or equal to the pressure P[Torr] expressed by the above-described equation Eq. (1) on the assumption that the weight of the target object is W[g]; the area of the side of the target object facing the electrostatic chuck is $S_{WP}[cm^2]$; and the pressure in the plasma generation space S is $P_S$[Torr]. Accordingly, it is possible to prevent the target object WP from jumping up or slipping off from the electrostatic chuck 40 due to the pressure $P_{He}$ of the gas supplied to the gap between the target object WP and the electrostatic chuck 40.

<Other Applications>

The present disclosure is not limited to the above-described embodiments, and various modifications can be made within the scope of the gist thereof.

Figure 7:
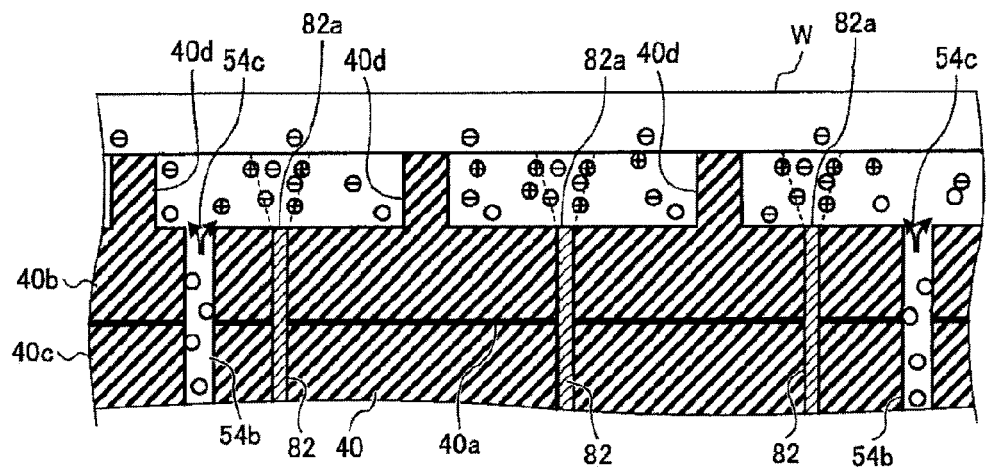
FIG. 7 schematically shows another example of the cross section of the electrostatic chuck.

For example, in the above-described embodiments, one optical fiber 82 is disposed in the mounting table 11. However, the present disclosure is not limited thereto. For example, as shown in FIG. 7, a plurality of optical fibers may be disposed in the mounting table 11. FIG. 7 schematically shows another example of the cross section of the electrostatic chuck 40. In the example of FIG. 7, the optical fibers 82 are disposed in the electrostatic chuck 40, and the end surfaces 82a of the optical fibers 82 are exposed to the gap between the target object WP and the electrostatic chuck 40. Then, UV light is irradiated to the gas supplied to the gap between the target object WP and the electrostatic chuck 40 from the end surface 82a of each of the optical fibers 82. Accordingly, the gas supplied to the gap between the target object WP and the electrostatic chuck can be ionized more quickly, and the charges of the target object WP can be neutralized more quickly.

Figure 8:
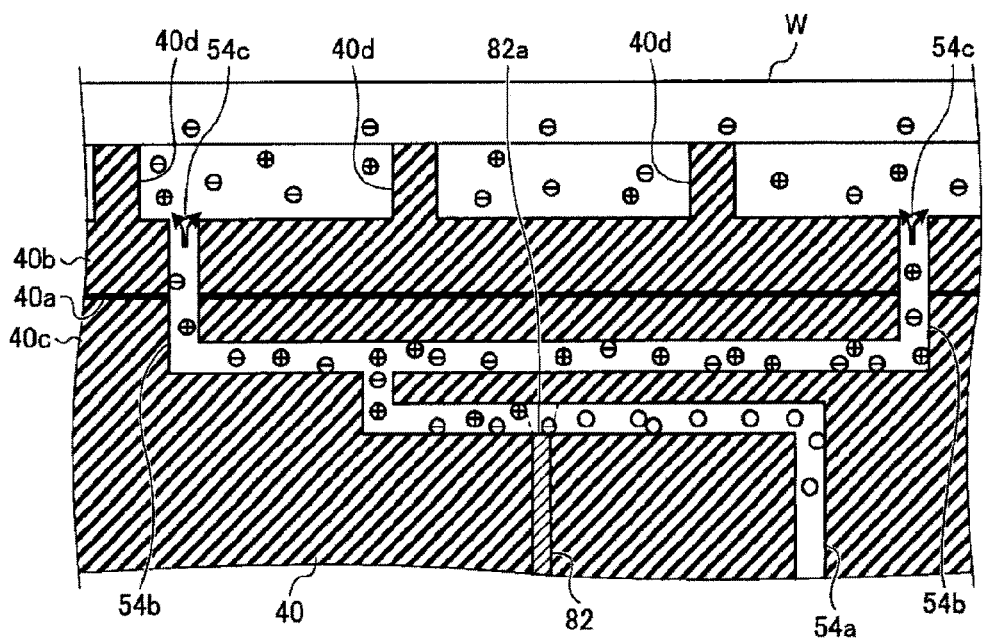
FIG. 8 schematically shows still another example of the cross section of the electrostatic chuck.

In the above-described embodiments, the end surface 82a of the optical fiber 82 disposed in the mounting table 11 is exposed to the gap between the target object WP and the electrostatic chuck 40. However, the present disclosure is not limited thereto. For example, as shown in FIG. 8, the end surface 82a of the optical fiber 82 may be exposed to the space in the first line 54a. FIG. 8 schematically shows still another example of the cross section of the electrostatic chuck 40. The gas ionized by irradiating UV light to the gas flowing through the first line 54a can be efficiently supplied to different locations between the target object WP and the electrostatic chuck 40 through each of the second lines 54b.

In the example of FIG. 8, the end surface 82a of the optical fiber 82 is not exposed to the gap between the target object WP and the electrostatic chuck 40. Therefore, even in the case of performing dry cleaning in the processing chamber 10 without using the target object WP, the end surface 82a of the optical fiber 82 is hardly damaged by plasma. Accordingly, the exchange cycle of the optical fiber 82 can be increased.

In the above-described embodiments, the gas supplied to the gap between the target object WP and the electrostatic chuck 40 hardly flows from the gap between the target object WP and the annular protrusion 40e of the electrostatic chuck 40. Therefore, after the gas pressure reaches a predetermined value, there is substantially no gas flow between the target object WP and the electrostatic chuck 40. Accordingly, as shown in FIG. 5, for example, the gas ionized by UV light irradiated from the end surface 82a of the optical fiber 82 is diffused in the gap between the target object WP and the electrostatic chuck 4. However, the present disclosure is not limited thereto.

Figure 9:
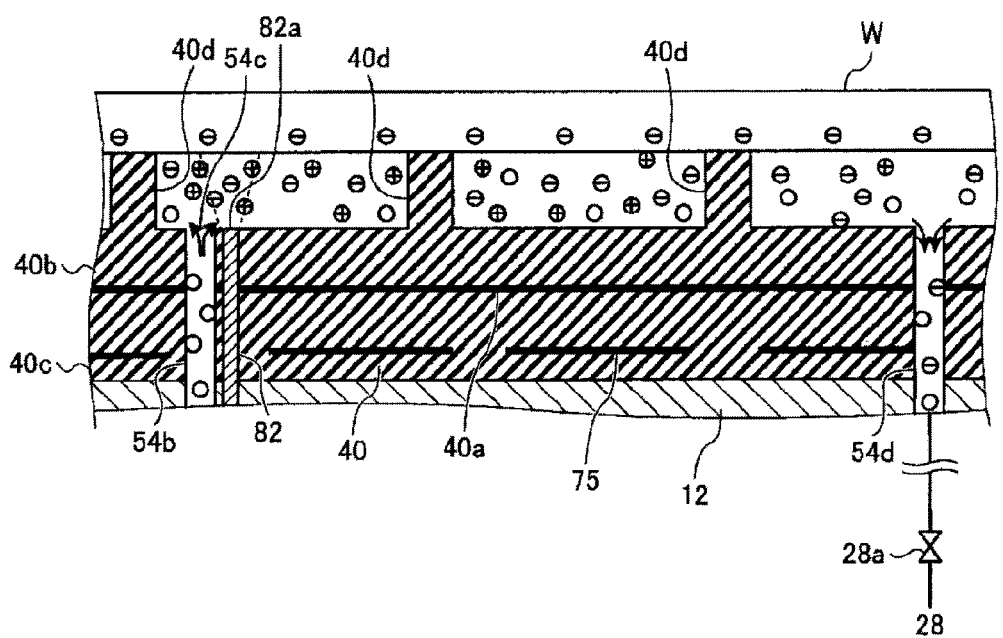
FIG. 9 schematically shows further still another example of the cross section of the electrostatic chuck.

FIG. 9 schematically shows further still another example of the cross section of the electrostatic chuck 40. For example, as shown in FIG. 9, a gas exhaust path 54d is disposed in the electrostatic chuck 40 and the base 12 and connected to the gas exhaust unit 28 via a valve 28a. The end surface 82a of the optical fiber 82 may be disposed near the opening 54c of the second line 54b. Therefore, gas flow from the opening 54c of the second line 54b to the gas exhaust path 54d is generated in the gap between the target object WP and the electrostatic chuck 40. Accordingly, the gas ionized near of the opening 54c of the second line 54b is quickly diffused in the gap between the target object WP and the electrostatic chuck 40. As a consequence, the charges of the target object WP can be neutralized more quickly.

In the above-described embodiments, the charge neutralization using plasma is performed after the processing (steps S13 to S14 in FIG. 6) and, then, the neutralization using UV irradiation is performed. However, the present disclosure is not limited thereto. Alternatively, the neutralization using UV irradiation may be performed after the processing without performing the neutralization using plasma. In addition, reverse voltage charge neutralization may be performed instead of the neutralization using plasma. In the reverse voltage charge neutralization, a predetermined gas such as an inert gas or the like is supplied into the processing chamber 10 and a voltage having a reverse polarity to that of the voltage applied to attract and hold the target object WP is applied to the electrode 40a of the electrostatic chuck 40. Accordingly, the charges of the target object WP are removed via the gas in the processing chamber 10.

In the above-described embodiments, the plasma etching apparatus has been described as an example of the apparatus for processing the target object WP. However, the present disclosure is not limited thereto, and can be applied to any processing apparatus having a mechanism for attracting and holding the target object WP using an electrostatic force during the processing of the target object WP, such as a film forming apparatus, a modification apparatus, a cleaning apparatus, or the like.

In the above-described embodiment, capacitively coupled plasma (CCP) was used as an example of the plasma source. However, the present disclosure is not limited thereto. The plasma source may be, e.g., inductively coupled plasma (ICP), microwave excitation surface wave plasma (SWP), electron cyclotron resonance plasma (ECP), helicon wave excitation plasma (HWP), or the like.

The embodiments of the present disclosure are illustrative in all respects and are not restrictive. The above-described embodiments can be embodied in various forms. Further, the above-described embodiments may be omitted, replaced, or changed in various forms without departing from the scope of the appended claims and the gist thereof.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made departing from the spirit of the disclosures. The accompanying claims and their equivalents are intended to cover such forms or modifications as would fall within the scope and spirit of the disclosures.

The invention claimed is:

1. A mounting table comprising:
    an electrostatic chuck configured to mount thereon a target object and attract and hold the target object using an electrostatic force;
    a gas supply line configured to supply a gas to a gap between the target object mounted on the electrostatic chuck and the electrostatic chuck, via the electrostatic chuck;
    at least one irradiation unit configured to irradiate light having a predetermined wavelength to the gas flowing through the gas supply line or to the gas supplied to the gap between the target object and the electrostatic chuck to ionize the gas, and
    an optical fiber disposed in the electrostatic chuck and configured to guide the light outputted from a light source disposed outside the mounting table to the irradiation unit.

2. The mounting table of claim 1, wherein the light is an ultra violet (UV) light, vacuum ultra violet (VUV) light, or soft X-ray.

3. The mounting table of claim 1, wherein the at least one irradiation unit includes two or more irradiation units disposed at the electrostatic chuck and each of the two or more irradiation units is configured to irradiate light having a predetermined wavelength to the gas supplied to the gap between the target object and the electrostatic chuck at a different location between the target object and the electrostatic chuck to ionize the gas.

4. The mounting table of claim 1, wherein the gas supply line includes:
    a first supply line; and
    a plurality of second gas supply lines connected to the first supply line and configured to distribute and supply the gas supplied to the first gas supply line to different locations between the target object and the electrostatic chuck, and
    wherein the at least one irradiation unit irradiates the light to the gas supplied through the first gas supply line to supply the ionized gas to the different locations between the target object and the electrostatic chuck.

5. The mounting table of claim 1, wherein a pressure of the gas supplied to the gap between the target object and the electrostatic chuck is lower than or equal to a pressure P expressed by the following equation Eq. (1):

$$P = P_S + (W/S_{WP}) \times 0.73556 \qquad \text{Eq. (1)}$$

where W is a weight of the target object; $S_{WP}$ is an area of the target object facing the electrostatic chuck; and $P_S$ is a pressure in a space facing a surface of the target object which is opposite to the surface facing the electrostatic chuck.

6. A charge neutralization method for a target object comprising:
    stopping supply of a voltage to an electrostatic chuck configured to mount thereon a target object and attract and hold the target object using an electrostatic force;
    supplying a gas to a gap between the target object mounted on the electrostatic chuck and the electrostatic chuck through a gas supply line formed in the electrostatic chuck; and
    ionizing the gas by irradiating light having a predetermined wavelength to the gas flowing through the gas supply line or to the gas supplied to the gap between the target object and the electrostatic chuck,
    wherein the light is outputted from a light source and guided through an optical fiber disposed in the electrostatic chuck to be irradiated from an end surface of the optical fiber to the gas supply line or to the gas supplied to the gap between the target object and the electrostatic chuck.

\* \* \* \* \*